(12) United States Patent
Ngu et al.

(10) Patent No.: US 11,637,173 B2
(45) Date of Patent: Apr. 25, 2023

(54) STRUCTURE INCLUDING POLYCRYSTALLINE RESISTOR WITH DOPANT-INCLUDING POLYCRYSTALLINE REGION THEREUNDER

(71) Applicant: GLOBALFOUNDRIES U.S. Inc., Santa Clara, CA (US)

(72) Inventors: Yves T. Ngu, Essex Junction, VT (US); Siva P. Adusumilli, South Burlington, VT (US); Steven M. Shank, Jericho, VT (US); Michael J. Zierak, Colchester, VT (US); Mickey H. Yu, Essex Junction, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 275 days.

(21) Appl. No.: 17/036,194

(22) Filed: Sep. 29, 2020

(65) Prior Publication Data

US 2022/0102480 A1   Mar. 31, 2022

(51) Int. Cl.
| | | |
|---|---|---|
| *H01L 49/02* | (2006.01) | |
| *H01L 27/12* | (2006.01) | |
| *H01L 21/3215* | (2006.01) | |
| *C30B 29/06* | (2006.01) | |

(52) U.S. Cl.
CPC ........ *H01L 28/24* (2013.01); *H01L 21/32155* (2013.01); *H01L 27/1207* (2013.01); *C30B 29/06* (2013.01)

(58) Field of Classification Search
CPC ............. H01L 28/24; H01L 21/32155; H01L 27/1207; H01L 27/1203; H01L 27/13; H01L 21/76283; H01L 21/26506; C30B 29/06; C30B 33/04; C30B 1/04

USPC ......................................................... 257/516
See application file for complete search history.

(56) References Cited

U.S. PATENT DOCUMENTS

| | | | |
|---|---|---|---|
| 4,916,507 A * | 4/1990 | Boudou | H01L 21/32155 |
| | | | 438/528 |
| 5,352,923 A | 10/1994 | Boyd et al. | |
| 6,191,007 B1 * | 2/2001 | Matsui | H01L 21/84 |
| | | | 438/455 |
| 7,084,483 B2 | 8/2006 | Aitken et al. | |
| 7,560,761 B2 | 7/2009 | Cheng et al. | |
| 8,377,790 B2 | 2/2013 | Kanike et al. | |
| 8,614,137 B2 | 12/2013 | Kemerer et al. | |

(Continued)

FOREIGN PATENT DOCUMENTS

JP    H0614532 B2 *   2/1994   ............. G05F 1/613

OTHER PUBLICATIONS

"Structure Including Polycrystalline Resistor With Dopant-Including Polycrystalline Region Thereunder", U.S. Appl. No. 17/036,194, filed Sep. 29, 2020.

(Continued)

*Primary Examiner* — Allen L Parker
*Assistant Examiner* — David W Houston, III
(74) *Attorney, Agent, or Firm* — Francois Pagette; Hoffman Warnick LLC

(57) ABSTRACT

A structure includes a semiconductor substrate, and a polycrystalline resistor region over the semiconductor substrate. The polycrystalline resistor region includes a semiconductor material in a polycrystalline morphology. A dopant-including polycrystalline region is between the polycrystalline resistor region and the semiconductor substrate.

18 Claims, 6 Drawing Sheets

(56) References Cited

U.S. PATENT DOCUMENTS

| | | | |
|---|---|---|---|
| 8,735,986 B2 | 5/2014 | Botula et al. | |
| 8,962,420 B2 | 2/2015 | Kurz et al. | |
| 9,716,136 B1* | 7/2017 | Abou-Khalil | H01L 21/84 |
| | | | 438/455 |
| 2005/0263850 A1* | 12/2005 | Aitken | H01L 27/101 |
| | | | 257/E27.071 |
| 2006/0166457 A1 | 7/2006 | Liu et al. | |
| 2006/0263957 A1* | 11/2006 | Wong | H01L 29/78675 |
| | | | 438/166 |
| 2011/0108919 A1 | 5/2011 | Chinthakindi et al. | |
| 2012/0196423 A1* | 8/2012 | Kanike | H01L 23/5256 |
| | | | 257/E21.546 |
| 2013/0140668 A1* | 6/2013 | Botula | H01L 21/823892 |
| | | | 257/499 |
| 2014/0183657 A1* | 7/2014 | Lim | H01L 27/0629 |
| | | | 438/238 |
| 2015/0031179 A1* | 1/2015 | Thurmer | H01L 27/0629 |
| | | | 438/238 |
| 2015/0179505 A1* | 6/2015 | Stuber | H01L 21/76224 |
| | | | 438/459 |
| 2016/0358905 A1 | 12/2016 | Balakrishnan et al. | |
| 2018/0285509 A1 | 10/2018 | Lo et al. | |

OTHER PUBLICATIONS

Office Action from related U.S. Appl. No. 17/182,415 dated Feb. 17, 2022.

Bulk Semiconductor Structure With a Multi-Level Polycrystalline Semiconductor Region and Method, U.S. Appl. No. 16/992,165, filed Aug. 13, 2020.

Field-Effect Transistors With a Polycrystalline Body in a Shallow Trench Isolation Region, U.S. Appl. No. 16/890,063, filed Jun. 2, 2020.

* cited by examiner

STRUCTURE INCLUDING POLYCRYSTALLINE RESISTOR WITH DOPANT-INCLUDING POLYCRYSTALLINE REGION THEREUNDER

BACKGROUND

The present disclosure relates to resistors, and more specifically, to a polycrystalline resistor including a dopant-including polycrystalline region thereunder.

Resistors are used in integrated circuit (IC) structures for a number of purposes. For example, in radio frequency (RF) applications such as power amplifiers, current density increases can lead to instability. In order to address the instability, ballast polycrystalline resistors may be provided to help regulate voltage flowing in the IC structure to avoid overloads. A ballast resistor may, for example, increase in resistance as increased current flows through it, and decrease in resistance as current decreases.

One challenge with ballast and other polycrystalline resistors is that they often include polycrystalline sections positioned over an oxide layer. The oxide layer can be relatively thick and prevent sufficient thermal transmission, which can lead to overheating of the device. The oxide may be provided, for example, as a shallow trench isolation (STI). One approach to improve thermal transmission is to thin the oxide, for example, to a thickness commonly used for gate dielectric layers. Unfortunately, using the thinner oxide with polycrystalline resistors can lead to break down of the oxide, which can lead to transmission of electrical noise into the substrate and performance degradation.

SUMMARY

An aspect of the disclosure is directed to a structure comprising: a semiconductor substrate; a polycrystalline resistor region over the semiconductor substrate, the polycrystalline resistor region including a semiconductor material in a polycrystalline morphology; and a dopant-including polycrystalline region between the polycrystalline resistor region and the semiconductor substrate, wherein a dopant of the dopant-including polycrystalline region includes a noble gas element.

Another aspect of the disclosure includes a structure, comprising: a semiconductor substrate; a polycrystalline resistor region over a semiconductor substrate, the polycrystalline resistor region including a semiconductor material in a polycrystalline morphology; an argon-including polycrystalline region between the polycrystalline resistor region and the semiconductor substrate; and an active device over the semiconductor substrate, wherein the active device includes a monocrystalline body and the argon-including polycrystalline region extends under the active device.

Yet another aspect of the disclosure related to a method comprising: implanting a noble gas element into: a first monocrystalline region in a semiconductor substrate to form a first dopant-including polycrystalline region, and one of: an oxide layer in the semiconductor substrate to create a dopant-including polycrystalline region under the oxide layer, and a second monocrystalline region in the semiconductor substrate to create a second dopant-including polycrystalline region; annealing to reform an upper portion of the first dopant-including polycrystalline region into a reformed monocrystalline active region, leaving a portion of the first dopant-including polycrystalline region as an isolation layer under the reformed monocrystalline active region; and forming an active device over the reformed monocrystalline active region and a polycrystalline resistor over the one of the oxide layer and the second dopant-including polycrystalline region, and wherein the oxide layer is part of one of a trench isolation arrangement, and a gate dielectric layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
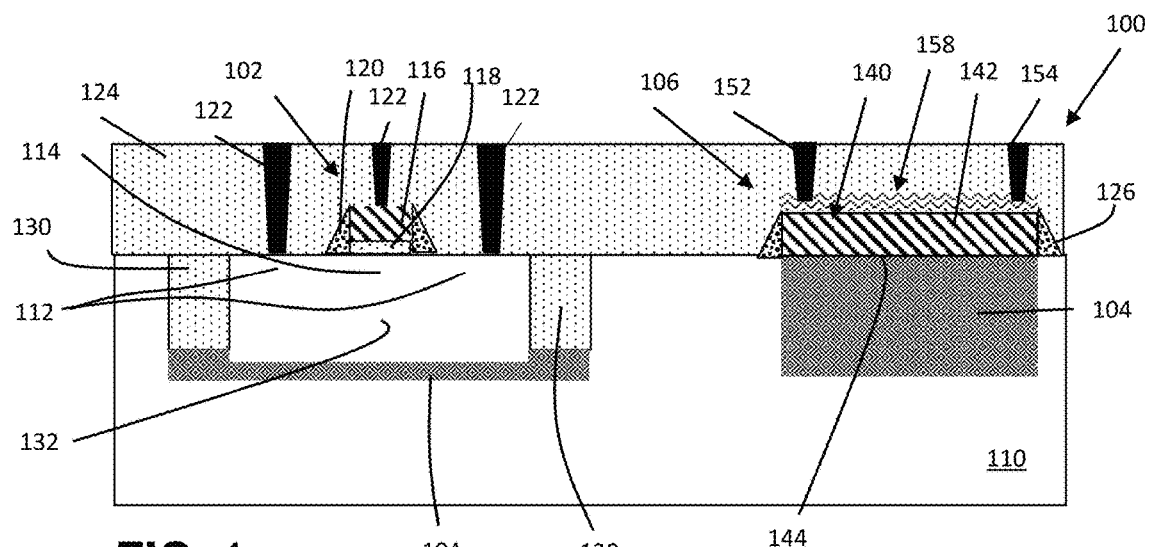
FIG. 1 shows a cross-sectional view of a polycrystalline resistor on a bulk semiconductor substrate, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a semiconductor substrate, and a polycrystalline resistor region over the semiconductor substrate. The polycrystalline resistor region includes a semiconductor material in a polycrystalline morphology. A dopant-including polycrystalline region is between the polycrystalline resistor region and the semiconductor substrate. The dopant may include a noble gas element. The dopant-including polycrystalline layer eliminates the need to thin oxide layers under a polysilicon resistor, and improves the resistor's self-cooling properties by improving thermal dissipation to the substrate. The dopant-including polysilicon isolation region beneath an active device also diminishes parasitic losses to the semiconductor substrate, ultimately providing thermal conductivity with reduced substrate coupling, and improved frequency response. The dopant-including polycrystalline layer can be used alone with the polycrystalline resistor. Alternatively, the dopant-including polycrystalline layer can be used under a gate dielectric layer used with a polycrystalline resistor, or under a shallow trench isolation (STI) used with a polycrystalline resistor. The dopant-including polycrystalline layer can also be used with polycrystalline resistors over a well region.

FIGS. 1-4 and 7-10 show cross-sectional views of a structure 100 according to various embodiments of the disclosure. Each figure shows a respective structure 100 including a polycrystalline resistor 106 adjacent an optional active device 102, e.g., a field effect transistor. As will be described, the formation of a dopant-including polycrystalline region 104 with a polycrystalline resistor 106 may impact the structure of active device 102.

Embodiments of structure 100 includes a semiconductor substrate. Referring to FIGS. 1-4, according to certain embodiments of the disclosure, structure 100 may include a bulk semiconductor substrate 110. Semiconductor substrate 110 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Structure 100 may optionally include active device 102. Active device 102 may include any now known or later developed transistor. FIG. 1 shows a non-limiting example of active device 102. Reference numbers for active device 102 are shown only FIG. 1 for clarity. Active device 102 may include, for example, source/drain regions 112, channel region 114, a gate 116, a gate dielectric layer 118 between gate 116 and channel region 114, and a gate spacer 120 about gate 116. Source/drain regions 112 may include any appropriate dopant within semiconductor substrate 110. Gate 116 may include polysilicon. A gate cap (not shown) of, for example, a nitride may also be formed over the gate region. Active device 102 alternatively may include, e.g., a capacitor, diode junction, resistor, and/or other electrically active element.

Gate dielectric layer 118 may include any now known or later developed gate dielectric materials such as but not limited to hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Spacer 120 may include any now known or later developed spacer material such as silicon nitride. Contacts 122 may be provided through an interlayer dielectric 124 to source/drain regions 112 and gate 116. Contacts 122 may include any now known or later developed contact structure and materials.

Active device 102 is separated from polycrystalline resistor 106 by trench isolation(s) 130. Trench isolations (TI) 130 include a trench etched into semiconductor substrate 110 and filled with an insulating material such as oxide, to isolate one region of the substrate from an adjacent region of the substrate. One or more transistors and/or passive devices (e.g., polycrystalline resistor 106, inductors, etc.) may be disposed within an area isolated by TI(s) 130. Each TI 130 may be formed of any currently-known or later developed substance for providing electrical insulation, and as examples may include: silicon nitride ($Si_3N_4$), silicon oxide (SiO$_2$), fluorinated SiO$_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. TI 130 may be provided as a shallow trench isolation (STI) or a deep trench isolation (DTI). In embodiments of structure 100 in FIGS. 1-4, active device 102 may include a monocrystalline body 132 (e.g., silicon) and dopant-including polycrystalline region 104 may extend under active device 102, e.g., under monocrystalline body 132 and TI(s) 130.

Structure 100 also includes polycrystalline resistor 106 having a polycrystalline resistor region 140 over semiconductor substrate 110. Polycrystalline resistor region 140 may include a semiconductor material 142 in a polycrystalline morphology. Semiconductor material 142 may be any of the polycrystalline material(s) described herein for semiconductor substrate 110. In certain embodiments, semiconductor material 142 includes polysilicon, and semiconductor substrate 110 includes silicon (monocrystalline). As illustrated, active device 102 may include polycrystalline gate 116, as described previously, in the same layer as resistor region 140. Thus, resistor region 140 is not necessarily embedded in semiconductor substrate 110. TI 130 electrically isolates active device 102 from polycrystalline resistor 106.

Structure 100 also includes dopant-including polycrystalline region 104 between polycrystalline resistor region 140 and semiconductor substrate 110. In the FIG. 1 embodiment, dopant-including polycrystalline region 104 contacts an underside 144 of polycrystalline resistor region 140. That is, dopant-including polycrystalline region 104 (hereinafter "polycrystalline region 104") is in direct contact with underside 144 of polycrystalline resistor region 140 (hereinafter "resistor region 140") with no intervening material. Polycrystalline region 104 improves the resistor's self-cooling properties by improving thermal dissipation to the substrate.

As will be described, polycrystalline region 104 may be formed by any currently known or later developed doping procedure, such as ion implantation. A dopant of polycrystalline region 104 may include a noble gas element, e.g., helium (He), neon (Ne), argon (Ar), krypton (Kr), xenon (Xe), radon (Rn), or combination thereof. In one particular embodiment, the dopant may include argon (Ar). Thus, polycrystalline region 104 may be an argon-including polycrystalline region. A spacer 126 may be positioned adjacent polycrystalline region 140 over semiconductor substrate 110. Spacer 126 may include, e.g., silicon nitride.

Figure 2:
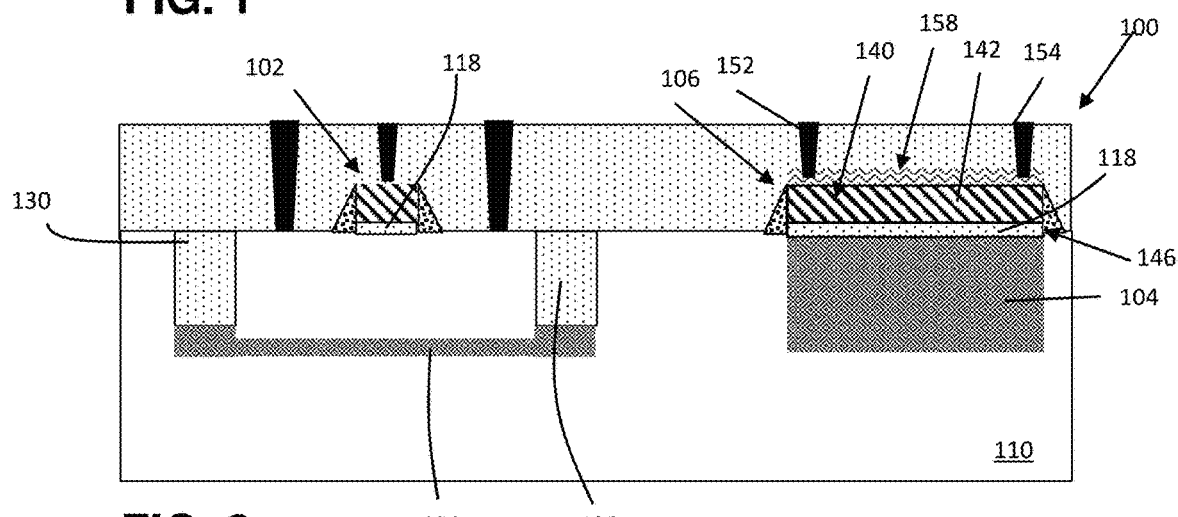
FIG. 2 shows a cross-sectional view of a polycrystalline resistor on a bulk semiconductor substrate, according to another embodiment of the disclosure.
Figure 3:
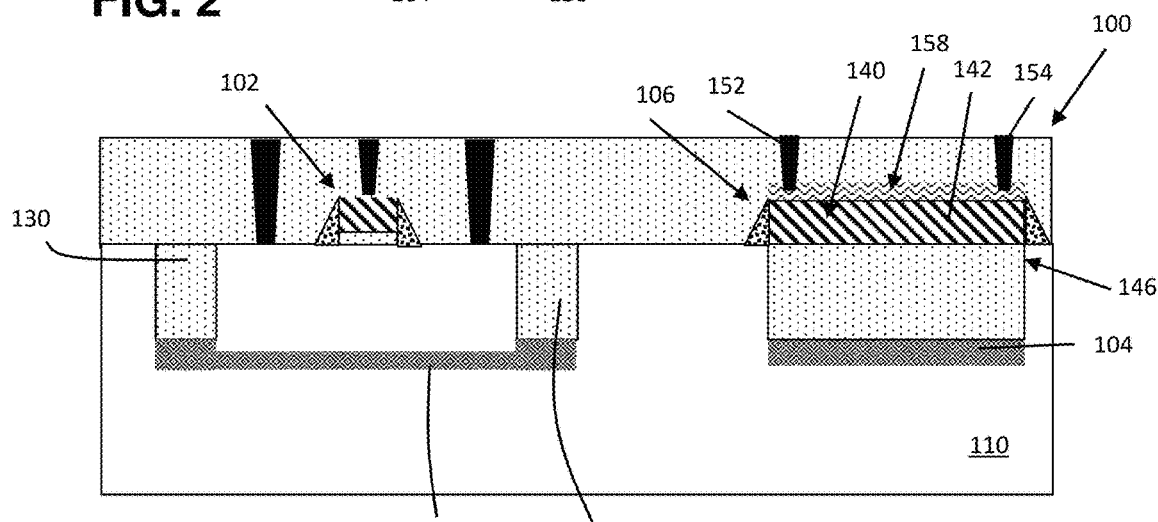
FIG. 3 shows a cross-sectional view of a polycrystalline resistor on a bulk semiconductor substrate, according to other embodiments of the disclosure.

FIGS. 2 and 3 show cross-sectional views of other embodiments of resistor region 140. In each of these embodiments, an oxide layer 146 is positioned between resistor region 140 and polycrystalline region 104. Here, polycrystalline region 104 provides additional electrical resistance and isolation for resistor region 140, but does not increase thermal resistance to heat transmission that would cause overheating of resistor region 140. FIG. 2 shows an embodiment in which oxide layer 146 is part of gate dielectric layer 118. That is, gate dielectric layer 118 formed perhaps with active device 102 remains over polycrystalline region 104 and under resistor region 140. FIG. 3 shows an embodiment in which oxide layer 146 is part of a trench isolation arrangement. In this example, oxide layer 146 may be part of TIs 130 formed to isolate, for example, active device 102 from other structure.

Figure 4:
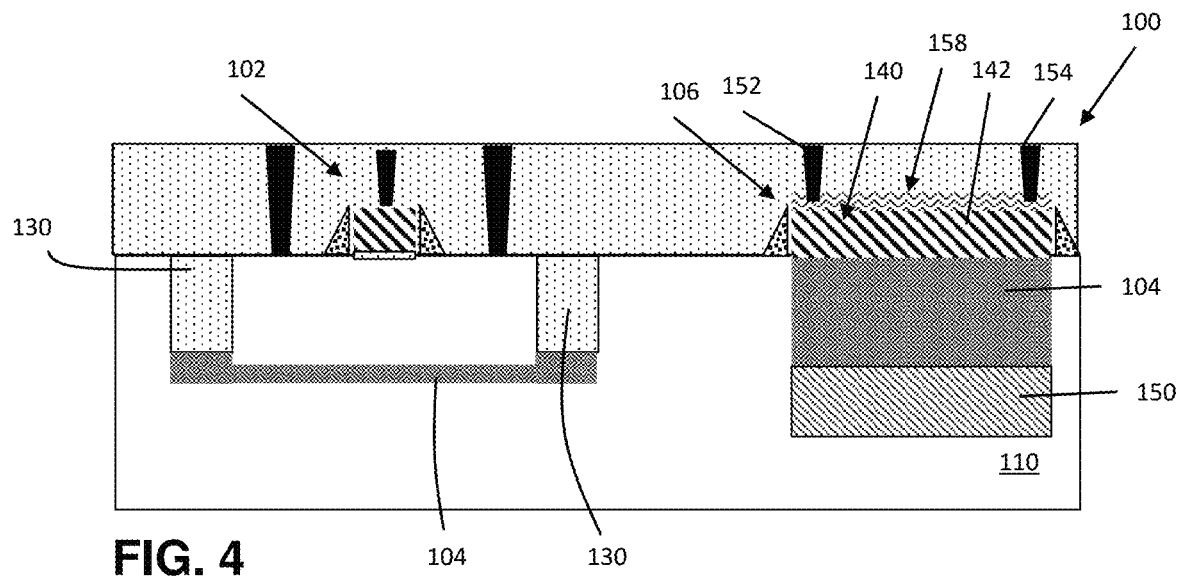
FIG. 4 shows a cross-sectional view of a polycrystalline resistor on a bulk semiconductor substrate, according to further embodiments of the disclosure.

FIG. 4 shows a cross-sectional view of another embodiment of structure 100. FIG. 4 illustrates structure 100 similar to that shown in FIG. 1, but also including a well region 150 in semiconductor substrate 110 under polycrystalline region 104. Here, resistor region 140 may also be employed with polycrystalline region 104 over well region 150, i.e., a well implant, in semiconductor substrate 110. Well region 150 may include any desired dopant, e.g., appropriate for the particular polarity of active device 102.

Figure 5:
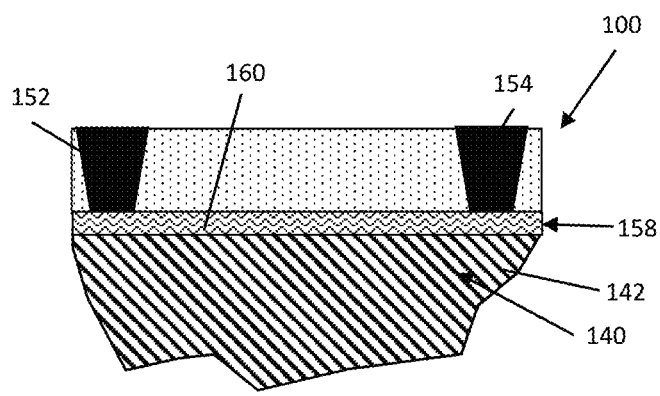
FIG. 5 show an enlarged cross-sectional view of a silicide layer over a polycrystalline resistor, according to embodiments of the disclosure.
Figure 6:
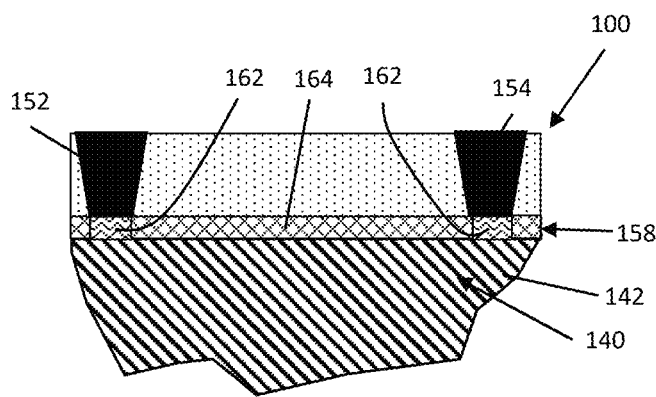
FIG. 6 show an enlarged cross-sectional view of a silicide layer over a polycrystalline resistor, according to other embodiments of the disclosure.

As shown in FIGS. 1-4, structure 100 may also include a first contact 152 and a second contact 154 on resistor region 140. First and second contacts 152, 154 are spatially separated. The distance between contacts 152, 154 may control the resistance value provided by resistor region 140. As shown in FIGS. 1-4, in certain embodiments, structure 100 may include a silicide layer 158 on resistor region 140. In one embodiment, shown in FIG. 5, silicide layer 158 includes an uninterrupted silicide layer 160 that extends from first contact 152 to second contact 154. This arrangement may use resistor region 140, for example, as a ballast resistor where the low sheet resistance of the silicide enables the formation of a low impedance resistance for device ballasting purposes. As shown in FIG. 6, in other embodiments, structure 100 may have first contact 152 to second contact 154 land on an discontinuous silicide layer 162 within a silicide-blocking layer 164. Discontinuous silicide layer 162 and silicide-blocking layer 164 are on resistor region 140. Silicide layers 160, 162 may be formed using any now known or later developed technique, e.g., performing an in-situ pre-clean, depositing a metal such as titanium, nickel, cobalt, etc., annealing to have the metal react with polysilicon, and removing unreacted metal.

FIGS. 7-10 show embodiments of structure 100 applied relative to a semiconductor-on-insulator (SOI) substrate 210 rather than bulk semiconductor substrate 110 (FIGS. 1-4). In these embodiments, active device 102 may be structured as described previously, or as a fin-type field effect transistor. SOI substrate 210 includes a semiconductor-on-insulator (SOI) layer 212 over a buried insulator layer 214 over a bulk semiconductor substrate 216. SOI layer 212 and substrate 216 may include any semiconductor material listed herein for bulk semiconductor substrate 110 (FIGS. 1-4). The choice of insulator layer 214 depends largely on intended application, with sapphire being used for radiation-sensitive applications and silicon oxide preferred for improved performance and diminished short channel effects in microelectronics devices. The precise thickness of buried insulator layer 214 and SOI layer 212 also vary widely with the intended application. In these embodiments, structure 100 may also include active device 102 over SOI substrate 210. However, polycrystalline region 104 does not extend under active device 102 where SOI substrate 210 is employed.

Figure 7:
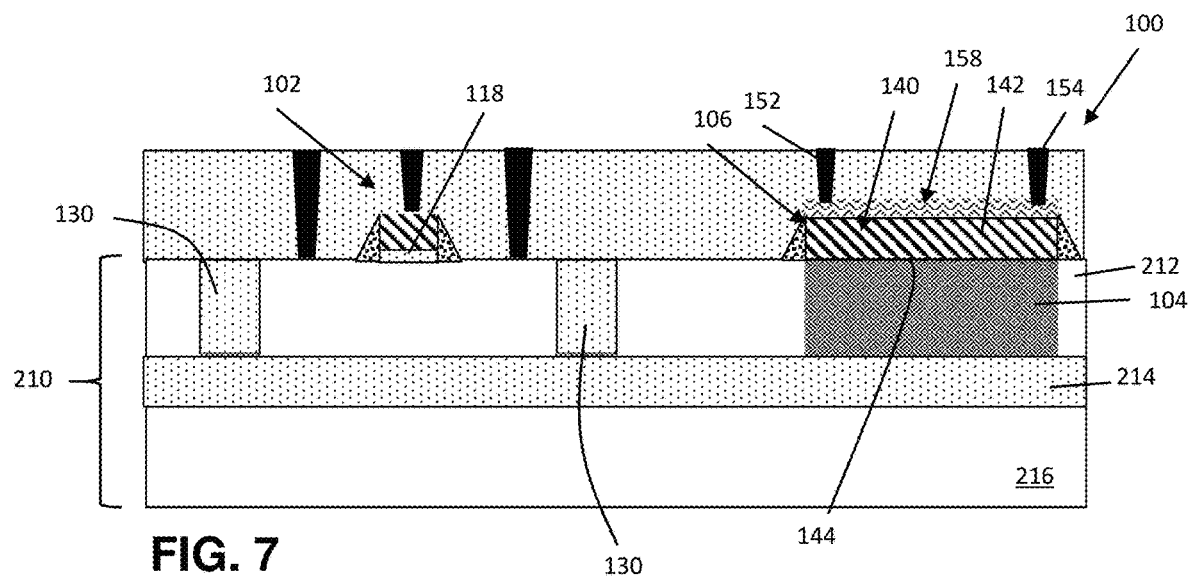
FIG. 7 shows a cross-sectional view of a polycrystalline resistor on an SOI semiconductor substrate, according to embodiments of the disclosure.

FIG. 7 shows a cross-sectional view of an SOI embodiment in which polycrystalline region 104 contacts underside 144 of resistor region 140. That is, polycrystalline region 104 is in direct contact with underside 144 of resistor region 140 with no intervening material.

Figure 8:
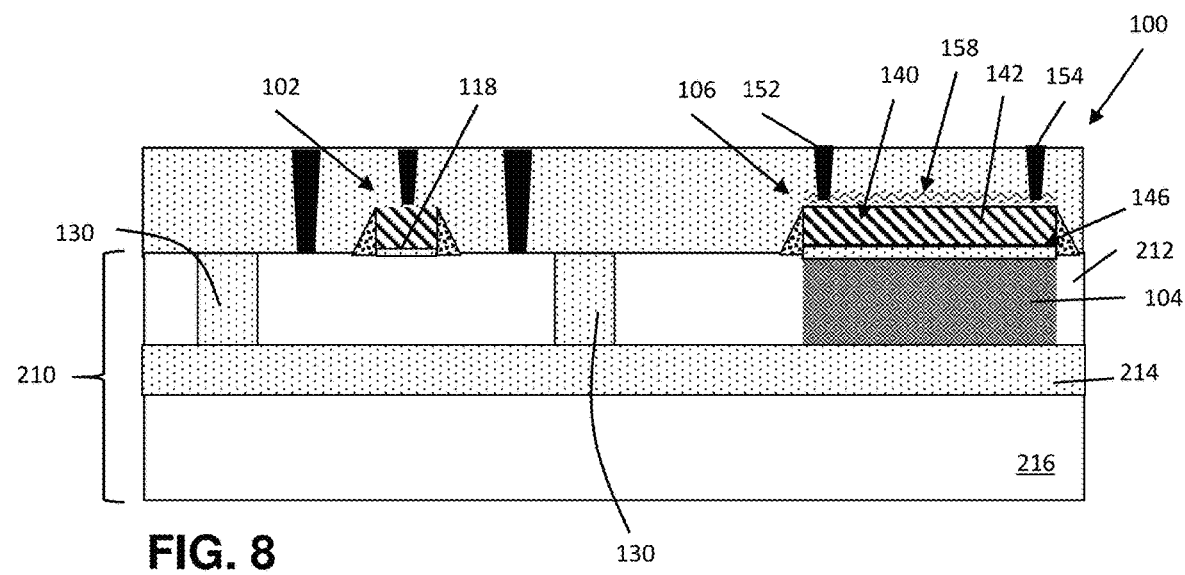
FIG. 8 shows a cross-sectional view of a polycrystalline resistor on an SOI semiconductor substrate, according to another embodiment of the disclosure.
Figure 9:
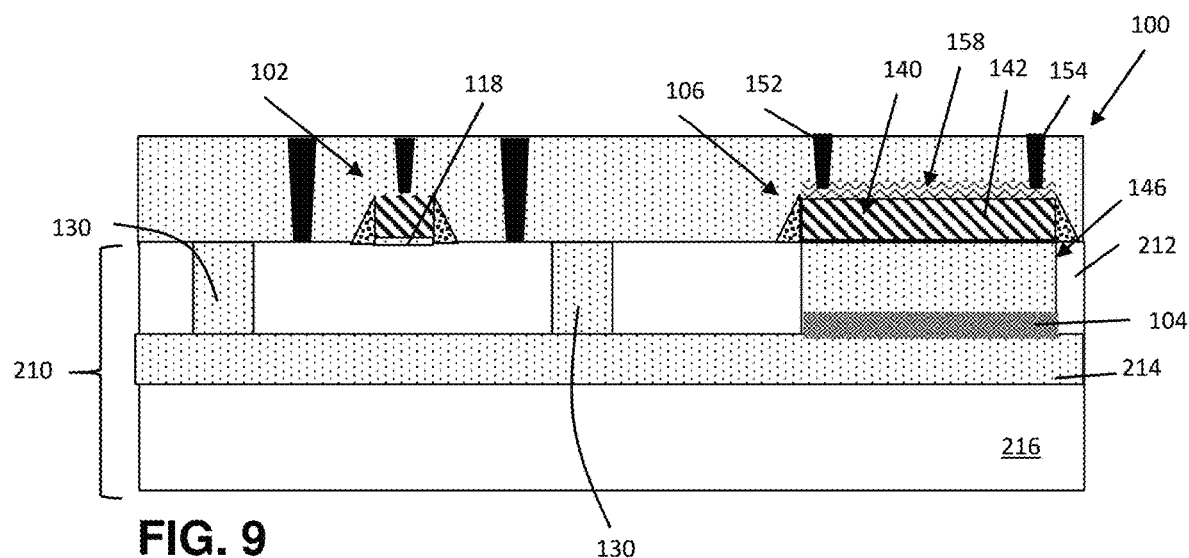
FIG. 9 shows a cross-sectional view of a polycrystalline resistor on an SOI semiconductor substrate, according to other embodiments of the disclosure.

FIGS. 8 and 9 show cross-sectional views of structure 100 with SOI substrate 210, and where oxide layer 146 is positioned between resistor region 140 and polycrystalline region 104. Here, polycrystalline region 104 improves the resistor's self-cooling properties by improving thermal dissipation to the substrate. FIG. 8 shows an embodiment in which oxide layer 146 is part of gate dielectric layer 118. That is, gate dielectric layer 118 is perhaps formed with active device 102 and remains over polycrystalline region 104 and under resistor region 140. FIG. 9 shows an embodiment in which oxide layer 146 is part of a trench isolation arrangement. In this example, oxide layer 146 is part of TIs 130 formed to isolate, for example, active device 102 from other structure.

Figure 10:
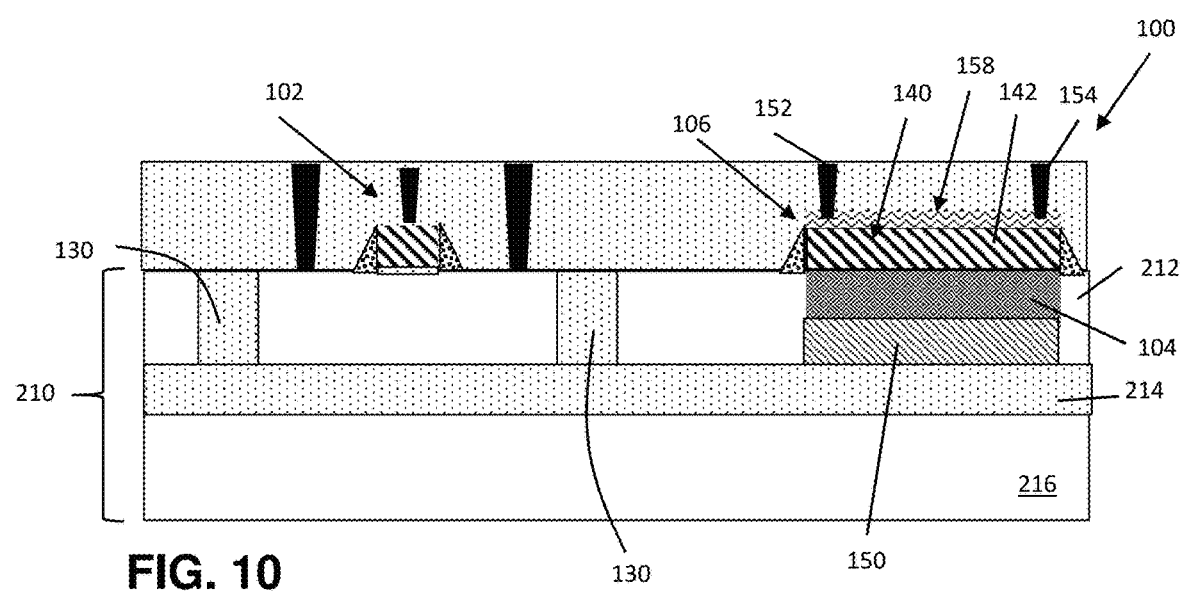
FIG. 10 shows a cross-sectional view of a polycrystalline resistor on an SOI semiconductor substrate, according to further embodiments of the disclosure.

FIG. 10 shows a cross-sectional view of another embodiment of structure 100 using SOI substrate 210 FIG. 10 illustrates that structure 100 may also include well region 150 in SOI layer 212 under polycrystalline region 104. Here, resistor region 140 may also be employed with polycrystalline region 104 over well region 150, i.e., a well implant, in SOI layer 212.

Contacts 152, 154 and silicide layer 160, as previously described, may also be employed with SOI substrate 210, as shown in FIGS. 7-10.

Referring to FIGS. 11-14, a method of forming structure 100 according to embodiments of the disclosure will now be described. It is noted that while the method will be described relative to a bulk semiconductor substrate 110 (FIGS. 1-4), it is equally applicable to SOI substrate 210 (FIGS. 7-10). FIGS. 11-14 show cross-sectional views of forming structure 100 (FIGS. 1-4, 7-10) at a number of lateral locations to illustrate formation of active device 102, and different varieties of resistor region 140 with polycrystalline region 104.

Figure 11:
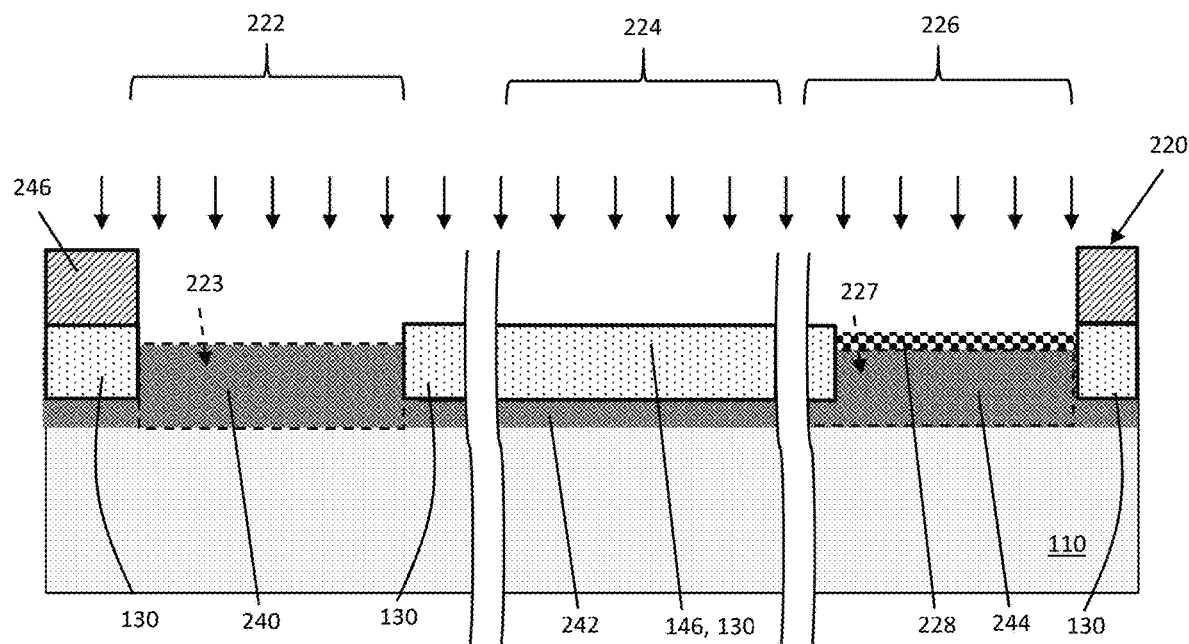
FIG. 11 shows a cross-sectional view of implanting a dopant into a preliminary structure for application of a method, according to embodiments of the disclosure.

FIG. 11 shows a cross-sectional view of a preliminary structure 220. At this stage, TI(s) 130 have been formed in semiconductor substrate 110 using any now known or later developed technique to create a number of electrically isolated regions 222, 224, 226. Region 222 is for active device 102 (FIGS. 1-4) and includes a first monocrystalline region 223 (dashed box). Region 224 is for one embodiment of polycrystalline resistor 106 (FIGS. 2-3) that includes an oxide layer 146. For illustrative purposes, region 224 has oxide layer 146 shown as TI(s) 130, as shown in FIG. 3, but it is recognized that oxide layer 146 could include gate dielectric layer 118 as in FIG. 2. Region 226 is for another embodiment of polycrystalline resistor 106 (FIG. 1). Region 226 includes a second monocrystalline region 227 (dashed box) in semiconductor substrate 110 for polycrystalline resistor 106 (FIG. 1) with no oxide layer. Region 226 also includes a nitride cap 228 thereover. Any nitride cap provided over regions 222, 224 has been removed at this stage.

FIG. 11 also shows introducing a noble gas element, e.g., ions via implanting (arrows) of a noble gas, into: first monocrystalline region 223 in semiconductor substrate 110 to form a first dopant-including polycrystalline region 240. In addition, depending on the form and number of region 224, 226 provided on substrate 110, the noble gas element may be implanted into: region 224 and into oxide layer 146 in semiconductor substrate 110 to create a dopant-including polycrystalline region 242 under oxide layer 146; and/or region 226 and into second monocrystalline region 227 in semiconductor substrate 110 to create a second dopant-including polycrystalline region 244. Dopant-including polycrystalline region(s) 240, 242, 244 eventually provide polycrystalline region(s) 104 (FIGS. 1-4, 7-10). Any form of mask 246 may be used to direct the implanting.

In implanting (or doping), a dosage and energy level are specified and/or a resulting doping level may be specified. A dosage may be specified in the number of atoms per square centimeter (atoms/cm$^2$) and an energy level (specified in keV, kilo-electron-volts), resulting in a doping level (concentration in the substrate) of a number of atoms per cubic centimeter (atoms/cm$^3$). The number of atoms is commonly specified in exponential notation, where a number like "3E15" means 3 times 10 to the 15th power, or a "3" followed by 15 zeroes (3,000,000,000,000,000). To put things in perspective, there are about 1E23 (100,000,000,000,000,000,000,000) atoms of hydrogen and oxygen in a cubic centimeter (cm3) of water. An example of doping is implanting with argon (Ar) with a dosage of between about 1E12 and 1E13 atoms/cm$^2$, and an energy of about 40 to 80 keV to produce a doping level of between 1E17 and 1E18 atoms/cm$^3$ ("atoms/cm$^3$" may also be written "cm$^3$"). The energy level may be controlled to control a depth of penetration of dopant into semiconductor substrate 110 in a known fashion. As noted, doping of polycrystalline regions 240, 242, 242 that result in polycrystalline region 104 (FIGS. 1-4, 7-10) may include implanted ions of a noble gas such as helium (He), neon (Ne), argon (Ar), krypton (Kr), xenon (Xe), radon (Rn), or a combination thereof. In one particular embodiment, the dopant may include implanted ions of argon (Ar). That is, polycrystalline region 104 is an argon-including polycrystalline region.

Figure 12:
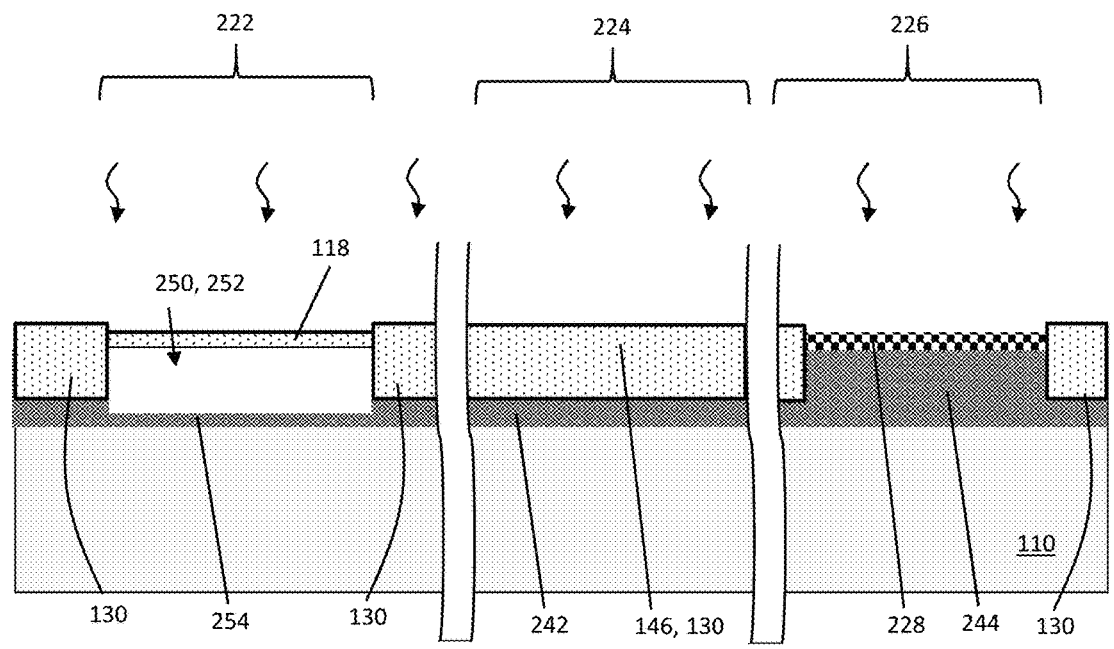
FIG. 12 shows a cross-sectional view of annealing to recrystallize a region of the structure, according to embodiments of the disclosure.

FIG. 12 shows a cross-sectional view of annealing (curved arrows) to reform an upper portion 250 of first dopant-including polycrystalline region 240 (FIG. 11) into a reformed monocrystalline active region 252, i.e., for active device 102 (FIG. 1). The annealing may have any duration and temperature necessary to obtain the desired amount of re-crystallization. The annealing leaves a portion of first dopant-including polycrystalline region 240 (FIG. 11) as an isolation layer 254 under reformed monocrystalline active region 252. Isolation layer 254 beneath active device 102 formed thereover with diminished parasitic losses to semiconductor substrate 110, and ultimately provides thermal conductivity with reduced substrate coupling, and improved frequency response. Where an SOI substrate 210 (FIGS. 7-10) is employed, isolation layer 254 is not formed because of the presence of buried insulator layer 214, see e.g., FIGS. 7-10. FIG. 12 also shows re-forming gate dielectric layer 118 in region 222, e.g., by deposition, which occurs post anneal.

Figure 13:
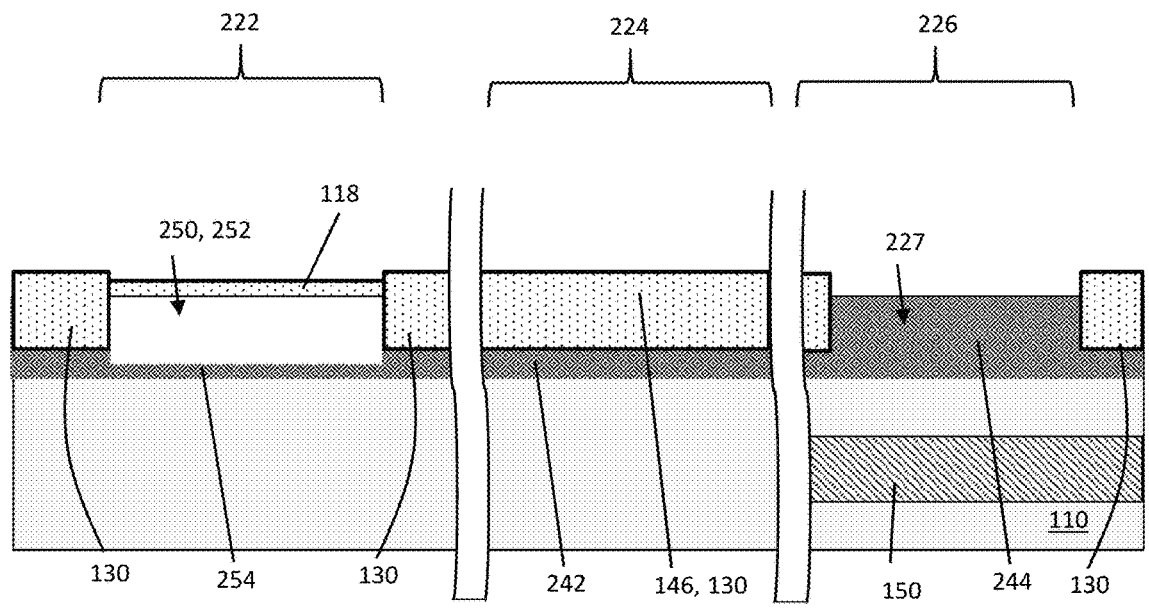
FIG. 13 shows a cross-sectional view of removing a nitride cap from a region of the structure, according to embodiments of the disclosure.

FIG. 13 shows removing a nitride cap 228 from over second dopant-including polycrystalline region 244, e.g., via a hot phosphorous wet etch. At this stage, any well implant formations may be performed, e.g., to create well region 150 (shown in FIG. 13, removed from latter figures).

Figure 14:
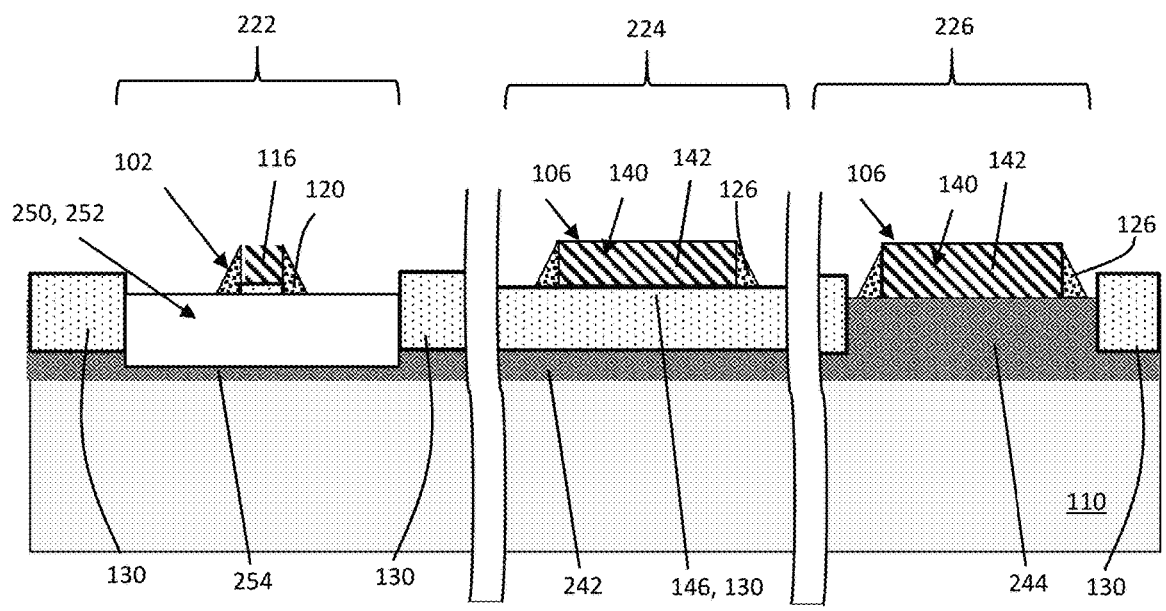
FIG. 14 shows a cross-sectional view of forming an active device and polycrystalline resistor in regions of the structure, according to embodiments of the disclosure.

FIG. 14 shows forming active device 102 over reformed monocrystalline active region 252 and polycrystalline resistor 140 over oxide layer 146 (region 224) and/or second dopant-including polycrystalline region 244. As noted, oxide layer 146 may be part of a TI 130 arrangement (FIG. 14), or gate dielectric layer 118 (FIG. 2). Active device 102 and polycrystalline resistor 140 may be carried out using any now known or later developed processes, e.g., polycrystalline material deposition and patterning, followed by spacer 120, 126 formation. While not shown in FIG. 14, it is recognized that polycrystalline resistors 140 with gate dielectric layer 118 or well region 150, as shown in FIGS. 2 and 4 respectively, can also be formed in this manner.

Middle-of-line processing and back-end-of-line processing follow, which includes formation of contacts 122, 152, 154 including silicide layer 158 (FIGS. 1, 5 and 6), vias, and wiring for an interconnect structure that is coupled to active device 102 and/or polycrystalline resistor 140.

Embodiments of structure 100 eliminate the need to thin the oxide layers such as an STI under a polysilicon resistor, and improves the resistor's self-cooling properties by improving thermal dissipation to the substrate. The dopant-including polycrystalline region beneath the active device diminishes parasitic losses to the semiconductor substrate, ultimately providing thermal conductivity with reduced substrate coupling, and improved frequency response.

The structure and method as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a semiconductor substrate;
a polycrystalline resistor region over the semiconductor substrate, the polycrystalline resistor region including a semiconductor material in a polycrystalline morphology;
a silicide layer on the polycrystalline resistor region, and including a first portion coupled to a first contact thereon and a second portion coupled to a second contact thereon; and
a dopant-including polycrystalline region between the polycrystalline resistor region and the semiconductor substrate,
wherein a dopant of the dopant-including polycrystalline region includes a noble gas element.

2. The structure of claim 1, wherein the dopant-including polycrystalline region contacts an underside of the polycrystalline resistor region.

3. The structure of claim 1, further comprising an oxide layer between the polycrystalline resistor region and the dopant-including polycrystalline region.

4. The structure of claim 3, wherein the oxide layer is part of a trench isolation arrangement.

5. The structure of claim 3, wherein the oxide layer is part of a gate dielectric layer.

6. The structure of claim 1, wherein the polycrystalline resistor region includes polysilicon and the semiconductor substrate includes monocrystalline silicon.

7. The structure of claim 1, wherein the dopant includes argon (Ar).

8. The structure of claim 1, further comprising an active device over the semiconductor substrate, and wherein the active device includes a monocrystalline body and the dopant-including polycrystalline region extends under the active device,
wherein the active device includes a polycrystalline gate in the same layer as the polycrystalline resistor region.

9. The structure of claim 1, wherein the semiconductor substrate includes a semiconductor-on-insulator (SOI) substrate including a semiconductor-on-insulator (SOI) layer over a buried insulator layer over a bulk semiconductor substrate, and
further comprising an active device over the SOI substrate, and wherein the dopant-damage polycrystalline region does not extend under the active device.

10. The structure of claim 1, further comprising a well region in the semiconductor substrate under the dopant-including polycrystalline region.

11. The structure of claim 1, wherein the silicide layer extends continuously horizontally from the first portion to the second portion.

12. The structure of claim 1, further comprising a silicide blocking layer horizontally between the first portion of the silicide layer and the second portion of the silicide layer, wherein the silicide layer is discontinuous between the first portion and the second portion.

13. A structure, comprising:
a semiconductor substrate;
a polycrystalline resistor region over a semiconductor substrate, the polycrystalline resistor region including a semiconductor material in a polycrystalline morphology;
a silicide layer on the polycrystalline resistor region, and including a first portion coupled to a first contact thereon and a second portion coupled to a second contact thereon;

an argon-including polycrystalline region between the polycrystalline resistor region and the semiconductor substrate; and an active device over the semiconductor substrate, wherein the active device includes a monocrystalline body and the argon-including polycrystalline region extends under the active device.

14. The structure of claim 13, wherein the argon-including polycrystalline region contacts an underside of the polycrystalline resistor region.

15. The structure of claim 13, further comprising an oxide layer between the polycrystalline resistor region and the argon-including polycrystalline region, and wherein the oxide layer is part of one of: a trench isolation arrangement, and a gate dielectric layer.

16. The structure of claim 13, further comprising a well region in the semiconductor substrate under the argon-including polycrystalline region.

17. A method comprising:

forming a first dopant including polycrystalline region by forming a first monocrystalline region in a semiconductor substrate and including a noble gas element therein;

forming an oxide layer in the semiconductor substrate to create a dopant-including polycrystalline region under the oxide layer;

forming a second monocrystalline region in the semiconductor substrate to create a second dopant-including polycrystalline region, wherein one of the oxide layer and second monocrystalline region include the noble gas element;

forming a reformed monocrystalline active region from an upper portion of the first dopant-including polycrystalline region, leaving a portion of the first dopant-including polycrystalline region as an isolation layer under the reformed monocrystalline active region;

forming an active device over the reformed monocrystalline active region and a polycrystalline resistor over one of the oxide layer and the second dopant-including polycrystalline region, wherein the oxide layer is part of one of a trench isolation arrangement and a gate dielectric layer;

forming a silicide layer on the polycrystalline resistor, the silicide layer including a first portion and a second portion; and forming a first contact on the first portion of the silicide layer and a second contact on the second portion of the silicide layer.

18. The method of claim 17, further comprising removing a nitride cap from over the second dopant-including polycrystalline region, prior to forming the active device.

* * * * *